United States Patent
Chow et al.

(10) Patent No.: US 9,074,295 B2
(45) Date of Patent: Jul. 7, 2015

(54) METHODS OF ETCHING CARBON NANOTUBE SHEET MATERIAL FOR ELECTRICAL CIRCUIT AND THIN FILM THERMAL STRUCTURE APPLICATIONS

(71) Applicant: Raytheon Company, Waltham, MA (US)

(72) Inventors: James R. Chow, San Gabriel, CA (US); Carl W. Townsend, Los Angeles, CA (US)

(73) Assignee: RAYTHEON COMPANY, Waltham, MA (US)

( * ) Notice: Subject to any disclaimer, the term of this patent is extended or adjusted under 35 U.S.C. 154(b) by 95 days.

(21) Appl. No.: 13/838,606

(22) Filed: Mar. 15, 2013

(65) Prior Publication Data

US 2014/0262821 A1    Sep. 18, 2014

(51) Int. Cl.
| C25F 3/14 | (2006.01) |
| C01B 31/02 | (2006.01) |
| B82Y 10/00 | (2011.01) |
| B82Y 40/00 | (2011.01) |
| H01L 21/3213 | (2006.01) |

(52) U.S. Cl.
CPC ............... *C25F 3/14* (2013.01); *C01B 31/0253* (2013.01); *B82Y 10/00* (2013.01); *B82Y 40/00* (2013.01); *H01L 21/32134* (2013.01)

(58) Field of Classification Search
CPC ................ C25F 3/02; C25F 3/12; C25F 3/14; H01L 51/0048; H01L 2221/1094
USPC .................................................. 205/666, 667
See application file for complete search history.

(56) References Cited

U.S. PATENT DOCUMENTS

| 6,802,954 B1 * | 10/2004 | Hemphill et al. ............. 205/640 |
| 8,900,029 B2 * | 12/2014 | Liu et al. ......................... 445/51 |
| 2004/0053499 A1 * | 3/2004 | Liu et al. ....................... 438/689 |
| 2004/0108298 A1 | 6/2004 | Gao |
| 2007/0069293 A1 | 3/2007 | Kavalieros et al. |
| 2012/0002135 A1 | 1/2012 | Hiraguri |
| 2012/0031872 A1 | 2/2012 | Sekigochi et al. |
| 2012/0292201 A1 | 11/2012 | Hsu |

FOREIGN PATENT DOCUMENTS

| TW | 200402081 | 7/1992 |
| TW | 200729407 | 9/1995 |
| TW | 201247941 A1 | 5/2011 |
| TW | 201202135 A1 | 1/2012 |

OTHER PUBLICATIONS

Notification of Transmittal of The International Search Report and The Written Opinion of the International Searching Authority, or the Declaration, PCT/US2013/047480, Sep. 13, 2013, 1 page.

(Continued)

*Primary Examiner* — Nicholas A Smith
(74) *Attorney, Agent, or Firm* — Daly, Crowley, Mofford & Durkee, LLP

(57) ABSTRACT

A method for etching Carbon Nanotube (CNT) sheet material for electrical circuit and thin film thermal structures. The method includes: forming an mask on a sheet of electrically conductive CNT material; and electrochemically removing unmasked portions of the CNT material.

30 Claims, 1 Drawing Sheet

(56) References Cited

OTHER PUBLICATIONS

International Search Report, PCT/US2013/047480 Sep. 13, 2013, 3 pages.
Written Opinion of the International Searching Authority, PCT/US2013/047480, Sep. 13, 2013, 5 pages.
Kwi Nam Han, Cheng Ai Li, Byunghee Han, Minh-Phuong Ngoc Bui, Xuan-Hung Pham Jaebum Choo, Mark Bachman, G.P. Li, Gi Hun Seong, Electrochemical Patterning of Transparent Single-Walled Carbon Nanotube Films on Plastic Substrates, American Chemical Society 2010, 6 pages.
Dacheng Wei, Yungi Lu, Lingchao Cao, Hongliang Zhang, Liping Huang, Cui Yu, Hisashi Kajiura, Yongming Li, Selective Electrochemical Etching of Single-Walled Carbon Nanotubes, Advanced Functional Materials, AFM Journal, pp. 3618-3624, Nov. 23, 2009.
S. Ssenyange, R. Du, M.T. McDermott, Fabrications of Arrays of Carbon Micro- and Nanostructures via Electrochemical Etching, Micro and Nano Letters, 2009, vol. 4, Issue 1, , pp. 22-26.
Office Action dated Apr. 15, 2015, Application No. 102123827, 5 pages.
Search Report dated Mar. 18, 2015, Application No. 102123827 with English Translation, 10 pages.

\* cited by examiner

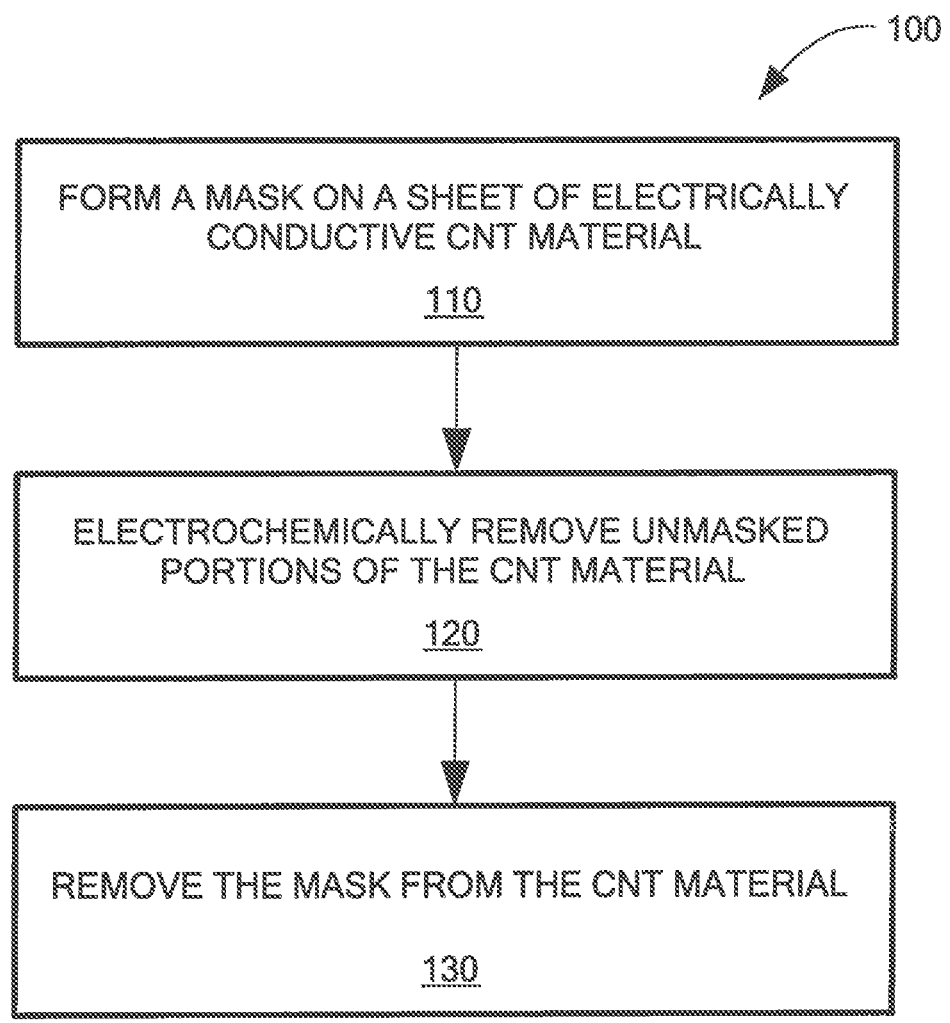

METHODS OF ETCHING CARBON NANOTUBE SHEET MATERIAL FOR ELECTRICAL CIRCUIT AND THIN FILM THERMAL STRUCTURE APPLICATIONS

TECHNICAL FIELD

This disclosure relates generally to Carbon Nanotube (CNT) Sheet Material and more particularly, to methods of etching Carbon Nanotube (CNT) sheet material for electrical circuit and thin film thermal structures.

BACKGROUND AND SUMMARY

As is known in the art, the growth of carbon nanotube material in the area of electrical circuit and thin film thermal structures has been limited by insufficient methodologies to create a diverse set of complex shapes coupled with small dimensions (~mils). Hand or manual cutting is tedious and cumbersome and cannot fabricate the exacting dimensions needed. Laser cutting is viable but produces structures one at a time which then must be transferred to the platform. The economy of scale gained by high volume manufacturing as observed in the circuit board industry is not gained.

Etching of CNT materials has taken place at the nano-dimensional level where single and small bundles of CNT tubes are oriented in microcircuit configurations to form electronic parts. Typical acid or base etchants used in semi-conductor processing as well as ozone have been used to fabricate electrical circuitry at the microscopic component level (<microns). Antenna circuit structures have also been fabricated by manual cutting and laser cutting. Examples of mm to meter size structures have also been reported.

In accordance with the present disclosure a method is provided for pattering a carbon nanotube material comprising electrochemically removing unmasked portions of the carbon nanotube material'

In one embodiment, a method is provided for etching Carbon Nanotube (CNT) sheet material for electrical circuit and thin film thermal structures. The method includes: forming a mask on a sheet of electrically conductive CNT material; and electrochemically removing unmasked portions of the CNT material.

In one embodiment, the method includes bonding removed CNT material to a substrate.

In one embodiment, the mask is removed from the CNT electrochemically.

In one embodiment, the electrochemical removing of the CNT includes placing the masked CNT material in a solution and applying an electrical potential between the solution and the electrically conductive CNT In one embodiment, the mask is electrically conductive.

In one embodiment, the solution is molten sodium nitrate.

In one embodiment, the solution is concentrated sodium hydroxide.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The single FIGURE is a flowchart of a method for etching Carbon Nanotube (CNT) sheet material for electrical circuit and thin film thermal structures according to the disclosure.

DETAILED DESCRIPTION

Referring now to the single FIGURE, a flow chart of a method for etching Carbon Nanotube (CNT) sheet material for electrical circuit and thin film thermal structures according to the disclosure is shown. The method 100 includes forming a mask on a sheet of electrically conductive CNT material 110; electrochemically removing unmasked portions of the CNT material 120; and removing the mask from the CNT material 130.

More particularly, the method includes the following steps:

(A) Providing a sheet of electrically conductive CNT; here for example a free standing sheet of CNT obtained from Nanocomp Technology 57 Daniel Webster Highway Merrimack, N.H. 03054, here for example having a thickness in the range of 0.5 to 2 mils;

(B) Electroplate the CNT sheet with an electrical conductor, for example, a flash of copper having a thickness of approximately 0.1 mils up to about 1.0 mils (C) Affixing a first mask to the copper to mask selected surface portions of the copper leaving masked portions over the desired electrical circuit or thermal conductor pattern to be formed in the underlying CNT (here, for example, the masking material is adhesive tape or photo-imagable resist materials as is used in the printed circuit board fabrication);

(D) Using the first mask, etching away the unmasked portion of the copper with $H_2SO_4$ to form an electrically conductive mask, here a copper mask leaving the underlying CNT attached to the patterned copper mask.

(E) Striping away the first mask from the patterned copper mask and CNT structure.

(F) Providing a vessel having of molten sodium nitrate at a temperature of approximately 400-500° C. Alternately, providing a vessel having a concentrated solution of sodium hydroxide, 25 to 65% in water at approximately 125 to 170° C.

(G) Immersing the structure resulting from step (E) in the of molten sodium nitrate or, alternatively, sodium hydroxide solution provided in Step (F);

(H) With the structure in the vessel with the of molten sodium nitrate solution or sodium hydroxide solution; applying 10 volts DC with one potential of the voltage on the CNT sheet and the other potential in the solution for approximately 10 seconds to one minute to etch away the portions of the CNT exposed by the etched away portions of the copper mask;

(I) Removing the structure from the vessel, cooling the removed structure, and rinsing away any remaining solidified sodium nitrate or sodium hydroxide in $H_2O$;

(J) Placing the removed, cooled and rinsed structure in a vessel having a solution of $H_2SO_4$ and $H_2O$, with the solution being approximately 10 percent $H_2SO_4$;

(K) Applying a voltage of approximate 0.5 to 5 volt DC between the solution and the CNT with the positive potential of the voltage applied to the CNT. This is an electrochemical process that removes the copper mask and leaves a free standing, patterned sheet of CNT material; and (L) Adhesively bonding the patterned, free standing CNT to any suitable dielectric such as a liquid crystal polymer or circuit board dielectric such as FR-4 or G-10 glass-reinforced epoxy laminates, for example.

This disclosure describes a circuit board-like process with the ability to etch the CNT material in a bath. The use of a flash of copper in defined coverage patterns allowed preferential etching between the copper mask.

A number of embodiments of the disclosure have been described. Nevertheless, it will be understood that various modifications may be made without departing from the spirit and scope of the disclosure. For example, while an electrically conducive mask was used on the CNT, the mask need not be electrically conductive in which the removal of the mask may be performed with a process other then electrochemical. Accordingly, other embodiments are within the scope of the following claims.

What is claimed is:

1. A method for etching Carbon Nanotube (CNT) sheet material for electrical circuit and thin film thermal structures, comprising:
   forming a mask on a sheet of electrically conductive CNT material; and
   electrochemically removing unmasked portions of the CNT material; and
   wherein the mask is electrically conductive and wherein the mask is removed electrochemically.

2. A method for etching Carbon Nanotube (CNT) sheet material for electrical circuit and thin film thermal structures, comprising:
   forming a mask on a sheet of electrically conductive CNT material; and
   electrochemically removing unmasked portions of the CNT material;
   wherein the electrochemical removing of the CNT includes placing the masked CNT material in a solution and applying an electrical potential between the solution and the electrically conductive CNT; and
   wherein the solution is molten sodium nitrate.

3. A method for etching Carbon Nanotube (CNT) sheet, comprising:
   providing a sheet of electrically conductive CNT material, such sheet having a thickness greater than 0.5 mils;
   forming a mask on the sheet of electrically conductive CNT material; and
   electrochemically removing unmasked portions of the CNT material.

4. The method recited in claim 3 wherein the electrochemical removing of the CNT includes placing the masked CNT material in a solution having a temperature of at least 125 degrees C. and applying an electrical potential between the solution and the electrically conductive CNT.

5. The method recited in claim 4 wherein the solution is a salt solution.

6. The method recited in claim 4 wherein the solution is a molten salt solution.

7. The method recited in claim 4 wherein the solution is a nitrate solution.

8. The method recited in claim 4 wherein the solution is a molten nitrate solution.

9. The method recited in claim 4 wherein the solution is a hydroxide.

10. The method recited in claim 4 wherein the solution has a concentration greater than 25 percent in water.

11. The method recited in claim 4 wherein the temperature is greater than 400 degrees C.

12. The method recited in claim 4 wherein the temperature is in a range from 400 degrees C. to 500 degrees C.

13. The method recited in claim 5 wherein the temperature is greater than 400 degrees C.

14. The method recited in claim 5 wherein the temperature is in a range from 400 degrees C. to 500 degrees C.

15. The method recited in claim 3 wherein sheet of electrically conductive CNT material has a thickness in a range from 0.5 mils to 2 mils.

16. The method recited in claim 15 wherein the electrochemical removing of the CNT includes placing the masked CNT material in a solution having a temperature of at least 125 degrees C. and applying an electrical potential between the solution and the electrically conductive CNT.

17. The method recited in claim 16 wherein the solution is a salt solution.

18. The method recited in claim 16 wherein the solution is a molten salt solution.

19. The method recited in claim 16 wherein the solution is a nitrate solution.

20. The method recited in claim 16 wherein the solution is a molten nitrate solution.

21. The method recited in claim 16 wherein the solution is a hydroxide.

22. The method recited in claim 16 wherein the solution has a concentration greater than 25 percent in water.

23. The method recited in claim 16 wherein the temperature is greater than 400 degrees C.

24. The method recited in claim 16 wherein the temperature is in a range from 400 degrees C. to 500 degrees C.

25. The method recited in claim 17 wherein the temperature is greater than 400 degrees C.

26. The method recited in claim 17 wherein the temperature is in a range from 400 degrees C. to 500 degrees C.

27. A method for etching Carbon Nanotube (CNT) sheet, comprising:
   providing a sheet of electrically conductive CNT material, such sheet having a thickness in a range from 0.5 mils to 2 mils;
   forming a mask on the sheet of electrically conductive CNT material; and
   electrochemically removing unmasked portions of the CNT material.

28. The method recited in claim 27 wherein the electrochemical removing of the CNT includes placing the masked CNT material in a solution having a temperature of at least 125 degrees C. and applying an electrical potential between the solution and the electrically conductive CNT.

29. A method for etching Carbon Nanotube (CNT) sheet material, comprising:
   forming a mask on a sheet of electrically conductive CNT material; and
   electrochemically removing unmasked portions of the CNT material; and
   wherein the mask is electrically conductive and wherein the mask is removed electrochemically.

30. A method for etching Carbon Nanotube (CNT) sheet material, comprising:
   forming a mask on a sheet of electrically conductive CNT material; and
   electrochemically removing unmasked portions of the CNT material;
   wherein the electrochemical removing of the CNT includes placing the masked CNT material in a solution and applying an electrical potential between the solution and the electrically conductive CNT; and
   wherein the solution is molten sodium nitrate.

* * * * *